United States Patent
Nowatzyk et al.

(10) Patent No.: US 11,836,598 B2
(45) Date of Patent: Dec. 5, 2023

(54) YIELD IMPROVEMENTS FOR THREE-DIMENSIONALLY STACKED NEURAL NETWORK ACCELERATORS

(71) Applicant: Google LLC, Mountain View, CA (US)

(72) Inventors: Andreas Georg Nowatzyk, San Jose, CA (US); Olivier Temam, Antony (FR)

(73) Assignee: Google LLC, Mountain View, CA (US)

( * ) Notice: Subject to any disclaimer, the term of this patent is extended or adjusted under 35 U.S.C. 154(b) by 415 days.

(21) Appl. No.: 17/213,871

(22) Filed: Mar. 26, 2021

(65) Prior Publication Data

US 2021/0216853 A1    Jul. 15, 2021

Related U.S. Application Data

(63) Continuation of application No. 15/685,672, filed on Aug. 24, 2017, now Pat. No. 10,963,780.

(51) Int. Cl.
*G06N 3/04*  (2023.01)
*G06F 1/14*  (2006.01)
(Continued)

(52) U.S. Cl.
CPC ......... *G06N 3/045* (2023.01); *G06F 11/1423* (2013.01); *G06F 11/2051* (2013.01);
(Continued)

(58) Field of Classification Search
CPC ............................ G06N 3/045; G06F 11/1423
See application file for complete search history.

(56) References Cited

U.S. PATENT DOCUMENTS

| | | |
|---|---|---|
| 5,422,983 A | 6/1995 | Castelaz et al. |
| 5,712,968 A | 1/1998 | Nakayama et al. |

(Continued)

FOREIGN PATENT DOCUMENTS

| | | |
|---|---|---|
| CN | 1191626 | 3/2005 |
| CN | 106462803 | 2/2017 |

(Continued)

OTHER PUBLICATIONS

EP Office Action in European Application No. 18766435.4, dated Sep. 8, 2021, 10 pages.

(Continued)

*Primary Examiner* — Joseph D Torres
(74) *Attorney, Agent, or Firm* — Fish & Richardson P.C.

(57) ABSTRACT

Methods, systems, and apparatus, including computer programs encoded on a computer storage medium, for three-dimensionally stacked neural network accelerators. In one aspect, a method includes obtaining data specifying that a tile from a plurality of tiles in a three-dimensionally stacked neural network accelerator is a faulty tile. The three-dimensionally stacked neural network accelerator includes a plurality of neural network dies, each neural network die including a respective plurality of tiles, each tile has input and output connections. The three-dimensionally stacked neural network accelerator is configured to process inputs by routing the input through each of the plurality of tiles according to a dataflow configuration and modifying the dataflow configuration to route an output of a tile before the faulty tile in the dataflow configuration to an input connection of a tile that is positioned above or below the faulty tile on a different neural network die than the faulty tile.

10 Claims, 6 Drawing Sheets

(51) Int. Cl.

| | |
|---|---|
| *G06N 3/045* | (2023.01) |
| *G06N 3/063* | (2023.01) |
| *G06F 11/20* | (2006.01) |
| *G06F 11/14* | (2006.01) |
| *H04L 45/02* | (2022.01) |
| *H04L 45/28* | (2022.01) |
| *H02J 50/10* | (2016.01) |
| *H04L 12/42* | (2006.01) |

(52) U.S. Cl.
CPC ............. *G06N 3/063* (2013.01); *H04L 45/06* (2013.01); *H04L 45/28* (2013.01); *H02J 50/10* (2016.02); *H04L 2012/421* (2013.01)

(56) References Cited

U.S. PATENT DOCUMENTS

| | | | |
|---|---|---|---|
| 7,426,501 | B2 | 9/2008 | Nugent |
| 7,804,504 | B1* | 9/2010 | Agarwal ............. G06F 15/7867 |
| | | | 716/112 |
| 9,882,562 | B1* | 1/2018 | Voogel ............... H03K 19/0008 |
| 10,650,286 | B2 | 5/2020 | Ben-Ari et al. |
| 2012/0256653 | A1 | 10/2012 | Cordero et al. |
| 2014/0095923 | A1 | 4/2014 | Rivera et al. |
| 2015/0355769 | A1 | 12/2015 | Kim et al. |
| 2016/0323137 | A1 | 11/2016 | Alvarez-Icaza et al. |
| 2016/0350645 | A1 | 12/2016 | Brothers et al. |
| 2016/0364644 | A1 | 12/2016 | Brothers et al. |
| 2018/0246853 | A1 | 8/2018 | Fowers et al. |
| 2019/0065937 | A1* | 2/2019 | Nowatzyk ........... G06F 11/1423 |

FOREIGN PATENT DOCUMENTS

| | | |
|---|---|---|
| TW | I527132 | 3/2016 |
| TW | I585584 | 6/2017 |

OTHER PUBLICATIONS

Office Action in Chinese Appln. No. 201880038452.5, dated Feb. 11, 2023, 26 pages (with English translation).

EP Office Action in European Appln. No. 18766435.4, dated Nov. 9, 2022, 7 pages.

Campbell et al. "3-D Wafer Scale Architectures for Neural Network Computing," IEEE Transactions on Components, Hybrids and Manufacturing Technology, vol. 16(7), Nov. 1, 1993, 10 pages.

Chen et al., "DaDianNao: A Machine-Learning Supercomputer," Proceedings of the 47th Annual IEEE/ACM International Symposium on Microarchitecture. IEEE Computer Society, 2014, 14 pages.

Chen et al., "DianNao: A Small-Footprint High-Throughput Accelerator for Ubiquitous Machine-Learning," ACM Sigplan Notices, 2014, vol. 49. No. 4. ACM, 15 pages.

Chi et al., "PRIME: A Novel Processing-in-memory Architecture for Neural Network Computation in ReRAM-based Main Memory," Proceedings of ISCA, 2016, vol. 43, 13 pages.

Kuroda. "ThruChip Interface for 3D system integration" IEEE 2010 International Symposium on VLSI Technology Systems and Applications, Apr. 26, 2010, 1 page.

Nomura et al. "3D Shared Bus Architecture Using Inductive Coupling Interconnect," IEEE $9^{th}$ International Symposium on Embedded Multicore/Many-Core Systems-on-Chip, Sep. 23, 2015, 8 pages.

Octcharov et al. "Accelerating Deep Convolutional Neural Networks Using Specialized Hardware," Microsoft Research Whitepaper 2(11), Feb. 2015, 4 pages.

PCT International Application No. PCT/US2018/047468, dated Dec. 4, 2018, 18 pages.

PCT International Preliminary Report on Patentability in International Application No. PCT/US2018/047468, dated Feb. 25, 2020, 11 pages.

TW Office Action in Taiwan Application No. 107129464, dated Aug. 22, 2019, 17 pages (with English translation).

Zhang et al. "Optimizing FPGA-based Accelerator Design for Deep Convolutional Neural Networks," Proceedings of the 2015 ACM. SIGDA International Symposium on Field-Programmable Gate Arrays. ACM, Feb. 22, 2015, 10 pages.

Notice of Allowance in Chinese Appln. No. 201880038452.5, dated Jun. 30, 2023, 7 pages (with English translation).

* cited by examiner

600

```
┌─────────────────────────────────────────────────────────────────────────┐
│ Determining that a tile from a plurality of tiles in a three-dimensional stacked neural │
│                          network is a faulty tile                                       │
│                                                                    602                  │
└─────────────────────────────────────────────────────────────────────────┘
                                        │
                                        ▼
┌─────────────────────────────────────────────────────────────────────────┐
│ Modifying the dataflow configuration to route an output of a tile before the faulty tile in the │
│ dataflow configuration to an input connection of a tile that is positioned above or below the │
│                    faulty tile on a different neural network      604                   │
└─────────────────────────────────────────────────────────────────────────┘
```

FIG. 6

YIELD IMPROVEMENTS FOR THREE-DIMENSIONALLY STACKED NEURAL NETWORK ACCELERATORS

CROSS REFERENCE TO RELATED APPLICATION

This application is a continuation of U.S. application Ser. No. 15/685,672, filed on Aug. 24, 2017. The disclosure of the prior application is considered part of and is incorporated by reference in the disclosure of this application.

BACKGROUND

This specification generally relates to three-dimensionally stacked neural network accelerators.

Neural networks are machine learning models that employ one or more layers of nonlinear units to predict an output for a received input. Some neural networks include one or more hidden layers in addition to an output layer. The output of each hidden layer is used as input to the next layer in the network, i.e., the next hidden layer or the output layer. Each layer of the network generates an output from a received input in accordance with current values of a respective set of parameters.

Typically, neural network processing systems use general purpose graphics processing units, field-programmable gate arrays, application-specific integrated circuits, and other hardware of the like to implement the neural network.

SUMMARY

In general, one innovative aspect of the subject matter described in this specification can be embodied in methods that include the actions of obtaining data specifying that a tile from a plurality of tiles in a three-dimensionally stacked neural network accelerator is a faulty tile. The three-dimensionally stacked neural network accelerator includes a plurality of neural network dies stacked on top of each other, each neural network die including a respective plurality of tiles, each tile has input and output connections that route data into and out of the tile. The three-dimensionally stacked neural network accelerator is configured to process inputs by routing the input through each of the plurality of tiles according to a dataflow configuration and modifying the dataflow configuration to route an output of a tile before the faulty tile in the dataflow configuration to an input connection of a tile that is positioned above or below the faulty tile on a different neural network die than the faulty tile.

Other embodiments of this aspect include corresponding systems, apparatus, and computer programs, configured to perform the actions of the methods, encoded on computer storage devices.

A neural network accelerator can be used to accelerate the computation of a neural network, i.e., the processing of an input using the neural network to generate an output or the training of the neural network to adjust the values of the parameters of the neural network. Three-dimensionally stacked neural network accelerators can be constructed with vertical interconnects that communicatively couple vertically adjacent dies. Three-dimensionally stacked neural network accelerators are cheaper to fabricate and more compact than traditional neural network accelerators. However, traditional mechanisms for fabricating three-dimensionally stacked neural network accelerators make it unlikely that a given three-dimensional neural network accelerators is fabricated with only functional dies, i.e., is fabricated without one or more dies being faulty.

Particular embodiments of the subject matter described in this specification can be implemented so as to realize one or more of the following advantages. For three-dimensionally stacked neural network accelerators, the more computing tiles that are stacked on top of each other, the higher the probability that the whole stack is faulty. This occurs because if one computing tile is faulty, this may render the entire three-dimensionally stacked neural network accelerator inoperable, resulting in potentially poor yield of operable three-dimensionally stacked neural network accelerators. However, modifying dataflow configurations for three-dimensionally stacked neural network accelerators increases functionality for the three-dimensionally stacked accelerators. For example, modifying the dataflow configuration allows the three-dimensionally stacked neural network accelerator to still be usable even if one or more computing tiles are faulty.

Attempting to use the faulty tiles will render the entire three-dimensionally stacked neural network accelerator useless. Therefore, the faulty tiles are bypassed to ensure functionality of the remaining portions of the three-dimensionally stacked neural network accelerator. Modifying the dataflow configuration for a three-dimensionally stacked neural network accelerator includes altering outputs of given computing tiles to inputs of computing tiles on dies above or below the given computing tiles. Thus, enabling a more modular flow of data throughout the three-dimensionally stacked neural network accelerators. In addition, modifying the dataflow configuration will improve the yield of operable three-dimensionally stacked neural network accelerators because having one or more faulty computing tiles will not render the entire accelerator inoperable. Three-dimensionally stacked neural network accelerator yields reduce as the total chip area increases. Modifying dataflow configuration to include transmitting data between vertically adjacent dies increases yields for three-dimensionally stacked neural network accelerators.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

FIG. 6 is a flowchart of an example process for modifying a dataflow configuration for tiles within a three-dimensionally stacked neural network accelerator.

Like reference numbers and designations in the various drawings indicate like elements.

DETAILED DESCRIPTION

The subject matter described in this specification relates to a hardware computing system including multiple computing units configured to accelerate workloads of a neural network. Each computing unit of the hardware computing system is self-contained and can independently execute computations required by a portion, e.g., a given layer, of a multi-layer neural network.

A neural network accelerator can be used to accelerate the computation of a neural network, i.e., the processing of an input using the neural network to generate an output or the training of the neural network to adjust the values of the parameters of the neural network. The neural network accelerator has data inputs and outputs. The neural network accelerator receives data, processes the data, and outputs the processed data. A three-dimensionally stacked neural network accelerator uses a plurality of neural network dies stacked on top of each other to increase computing power for a neural network accelerator. Each neural network accelerator die includes a plurality of computing tiles. Each computing tile also has an input, an output, and processes data using a computing tile processor.

Tiles are connected together in sequence and the neural network accelerator directs data between each of the tiles according to a dataflow configuration. For example, data is received at a first computing tile, a computation is executed, and the first tile's output is transmitted to the input of a second computing tile, which also completes a computation. In some instances, a computing tile may be faulty (i.e., not functioning as intended) after the accelerator has been manufactured. For example, the tile may have non-functioning on-die cache memory, damaged intra-die connections, an incorrect clock, and so on, which may render the entire neural network accelerator inoperable.

However, according to the systems and methods described herein, a faulty computing tile is bypassed during computation by the neural network accelerator, i.e., no output is transmitted to the faulty computing tile's input. Instead of routing an output of one tile to the input of the faulty tile, the output is routed to an input of a different computing tile that is on a die above or below the die that houses the faulty tile. After the different computing tile executes its computation, the different computing tile sends its output to an input of another computing tile, e.g., a computing tile that is housed on same neural network die that houses the faulty computing tile. This bypasses the faulty tile and enables the use of the three-dimensionally stacked neural network accelerator even with one or more faulty tiles.

Figure 1A:
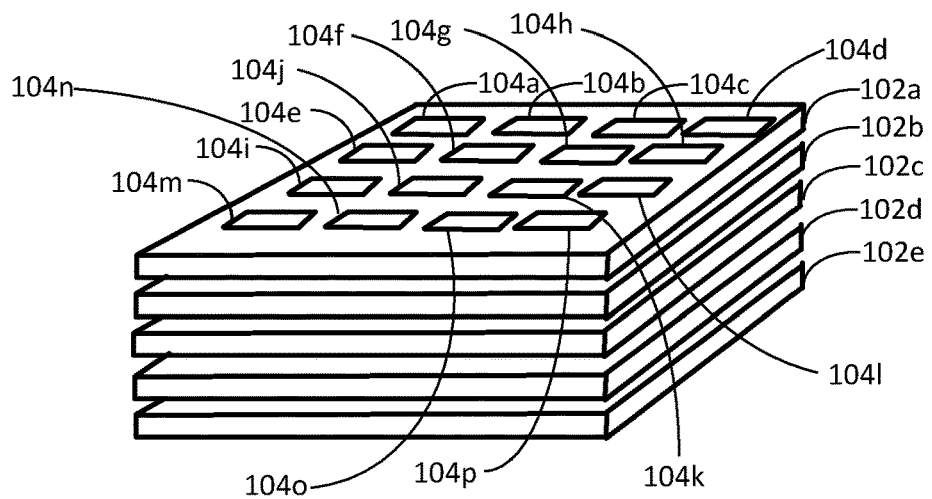
FIGS. 1A-B are block diagrams of an example three-dimensionally stacked neural network accelerator.
Figure 1B:
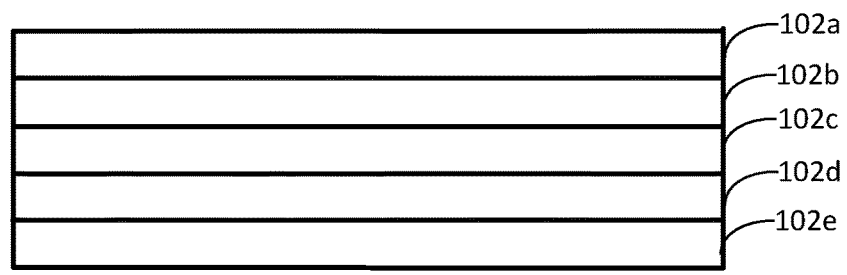

FIGS. 1A-B are block diagrams of an example three-dimensionally stacked neural network accelerator 100. A neural network accelerator 100 is an integrated circuit that is designed to accelerate the computation of a neural network, i.e., the processing of an input using the neural network to generate an output or the training of the neural network. A three-dimensionally stacked neural network accelerator 100 includes a plurality of neural network accelerator dies 102a-e stacked on top of each other creating a large-scale neural network accelerator.

Typically, a neural network accelerator wafer 102a-e is created using semiconductor material (e.g., silicon, gallium arsenide, indium arsenide, etc.). Neural network accelerator dies 102a-e are manufactured using traditional semiconductor wafer fabrication techniques. Each of the neural network accelerator dies 102a-e include a plurality of computing tiles, hereafter referred to as tiles 104a-p, arranged on a surface of the die 102a-e.

Each tile 104a-p is an individual computing unit and the tiles 104a-p collectively perform processing that accelerate computations across the three dimensionally stacked neural network accelerator. Generally, a tile 104a-p is a self-contained computational component configured to execute all or portions of the processing for a neural network computation. Example architectures for the tiles 104a-p are described in U.S. patent application Ser. No. 15/335,769, which is incorporated herein by reference.

The tiles on each die are connected according to a static interconnect system. For example, each tile is communicatively coupled, using inductive coupling, through silicon via (TSV), or wired to one or more adjacent tiles including adjoining tiles, tiles above each other, tiles below each other, etc.). The configuration of a static interconnect system will be described in more detail below in connection with FIG. 3.

Figure 2:
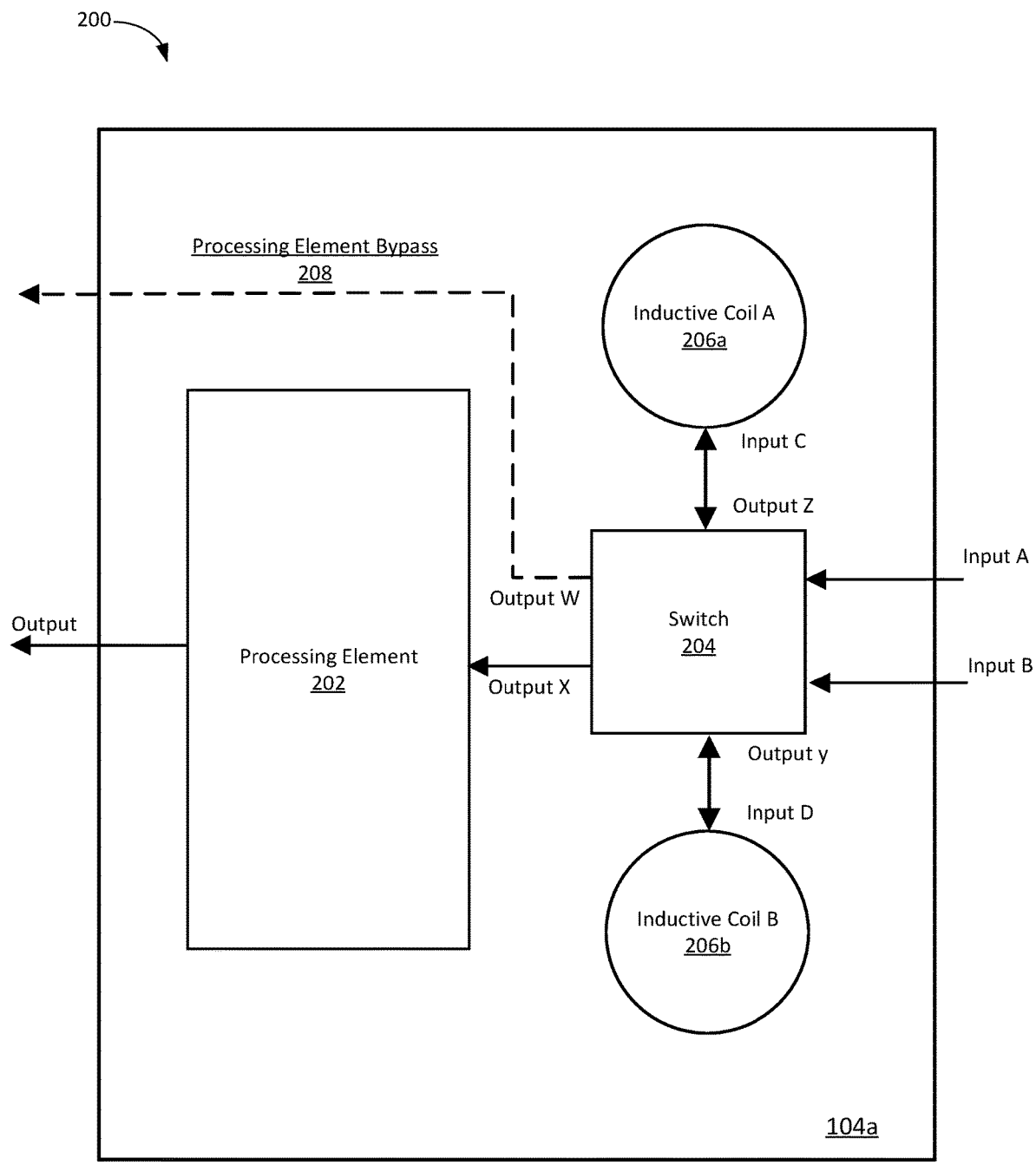
FIG. 2 is a block diagram of a computing tile.

FIG. 2 is a block diagram of a computing tile 104a. Each computing tile 104a includes a processing element 202, a switch 204, inductive coils 206a and 206b, and a processing element bypass 208. The components illustrated in FIG. 2 are not drawn to scale. Typically, the processing unit 202 consumes most of the tile area and is more likely to have a defect or fault. Defect density of computing tiles is uniform, thus the large area of the processing element 202 causes the processing element 202 the component most likely to fail. The processing element receives an input from an output of the switch 204. The processing element 202 executes computations for the neural network accelerator. The output of the processing element 202 can be transmitted to the input of a switch 204 of a different tile 104a-p.

Some or all of the tiles 104a-p include inductive coils 206a, b. Although, FIG. 2 illustrates a tile 104a with two inductive coils 206a, b, typically, and in some implementations, the computing tile can include between 10 and 1000 coils. The inductive coils enable inductive coupling of vertically adjacent tiles 104a-p using magnetic fields between the tiles 104a-p. The inductive coupling of tiles 104a-p enables tiles 104a-p on different dies to communicate using near field wireless communication. Each tile 104a-p communicates with adjacent tiles above or below the tile using the inductive coupling. For example, the first tile 104a on the top die 102a can transmit and receive data from the first tile 104a on the second die 102b located under the top die 102a.

Typically, tiles 104a-p communicate with adjacent tiles directly above or below itself using inductive coupling. However, in some implementations, tiles within a three-dimensionally stacked neural network accelerator can communicate with tiles on any die 102a-e within the three-dimensionally stacked neural network accelerator 100. For example, for a three dimensionally stacked neural network accelerator with 7 stacked dies, a particular tile positioned on a given die can vertically communicate with tiles above or below the particular tile on any of the other 6 stacked dies. One way of implementing the near-field communication technology is described in "ThruChip Interface for 3D system integration" by Tadahiro Kuroda at http://ieeexplore.ieee.org/document/5496681/.

The inductive coils 206a, b included in the tile 104a are a receiver coil and a transmitter coil. The receiver and transmitter coils can each include a plurality of inductive coils coupled together to transmit and receive data from vertically adjacent tiles. The plurality of inductive coils are coupled together to achieve the desired bandwidth and magnetic fields to communicate data between vertically adjacent tiles. Either of the inductive coils 206a, b can be selected to be the receiver coil or the transmitter coil according to the determined dataflow configuration. The receiver and transmitter coil respectively and independently receive or transmit data between tiles 104a-p on different dies. The coils each produce a magnetic field and using the magnetic field the tiles communicate using near field communication. For example, the magnetic field belonging to a transmitter coil on a given tile 104a-p is coupled to a magnetic field belonging to a receiver coil 104a-p of a different tile. The two coils transfer data by using the magnetic field created by the inductive coupling as a carrier signal.

The inductive coils 206a, b can each be selectively chosen as the receiver coil or the transmitter coil. The inductive coils 206a, b are determined to be a receiver coil or a transmitter coil based on the configuration of the inputs and the outputs of the switch 204. For example, the inductive coil that receives an output of the switch is the transmitter coil as it will transmit the received data to a vertically adjacent tile. The transceiver that transmits data to an input of switch is the receiver coil because this transceiver transmits the data it receives from a vertically adjacent coil. Modifying the variable inputs and outputs that are defined by the configuration of the switch enables the static interconnect configuration to be changed to determine various dataflow configurations.

In some implementations, each tile can also communicate with vertically adjacent tiles using through-silicon vias (TSV). A TSV is a vertical electrical connection that passed through the die. Outputs of processing units can be passed to the input of a switch 204 belonging to a vertically adjacent die using TSVs.

Each tile includes a switch 204 that is coupled to a plurality of inputs and includes a plurality of outputs. In some implementations and as shown in FIG. 2, the switch has four inputs (i.e., inputs A, B, C, and D) and four outputs (i.e., outputs W, X, Y, and Z). The switch 204 can direct any of the plurality of inputs received at the switch to any of the plurality of switch outputs. In this instance, the input A can be a processing element bypass of an adjacent tile. Input B can be the output of the processing element 202 of an adjacent tile. Either inductive coil can be selected as the receiver coil or the transmitter coil. Whichever inductive coil is configured as the transmitter coil sends data to vertically adjacent tiles and whichever coil is configured as the receiver coil receives data from vertically adjacent tiles. In the instance where inductive coil A 206a is receiver coil, input C can be data received at inductive coil A 206a and transmitted to the switch 204. Alternatively, and based on the selected dataflow configuration, in the instance where inductive coil B 206b is the receiver coil, input D can be data received at inductive coil B 206b and transmitted to the switch 204.

The switch 204 can transmit data from any of the inputs, inputs A, B, C, or D, to any of the outputs, outputs W, X, Y, and Z. In this instance, output W can direct data to a processing element bypass. The processing element bypass provides a data transmission path that bypasses the processing element 202. Output W enables data to transmitted out of the processing tile without transmitting the data to the processing element 202. In this instance, the processing element 202 could be faulty. Therefore, the processing element 202 is bypassed, using the processing element bypass, to ensure continuity of the ring bus. Output X of the switch 204 is coupled to the input of the processing element 202. Thus, data transmitted by output X of the switch is transmitted to the processing element 202 such that the processing element 202 uses the data for neural network accelerator computations. Outputs Y and Z are each coupled to the inputs of inductive coil A and B 206a, b. Outputs Y and Z can be selectively chosen to direct data that is transmitted to inductive coils of vertically adjacent tiles.

In some implementations, tiles 104a-p communicating with tiles 104a-p on different dies 102a-e use the inductive coupling of the inductive coils to transmit input data from tiles on different dies 102a-e. For example, in the instance where the first tile 104a on the top die 102a communicates with the first tile 104a on the die 102b below the top die 102a, the first tile 104a on the top die's switch is coupled to output Y. Output Y transmits data to the transmitting inductive coil, which directs the data to the receiving inductive coil of the first tile 104a on die 102b below. The receiving inductive coil directs the data to the switch 204 of the first tile 104a on die 102b below. The switch 204 can direct the data to either of the available switch outputs. In other implementations, tiles 104a-p communicating with tiles 104a-p on different dies 102a-e use through silicon via technology to transmit the data.

In some implementations, the switch 204 can include one or more multiplexers and one or more demultiplexers. A multiplexer includes two or more selectable inputs and one output. The demultiplexer includes one input and two or more selectable outputs. Accordingly, and in this instance, the switch uses the multiplexer to receive either of the four inputs, and the output of the multiplexer is coupled to the input of the demultiplexer. The outputs of the demultiplexer are the four outputs of the switch, outputs W, X, Y, and Z.

Figure 3:
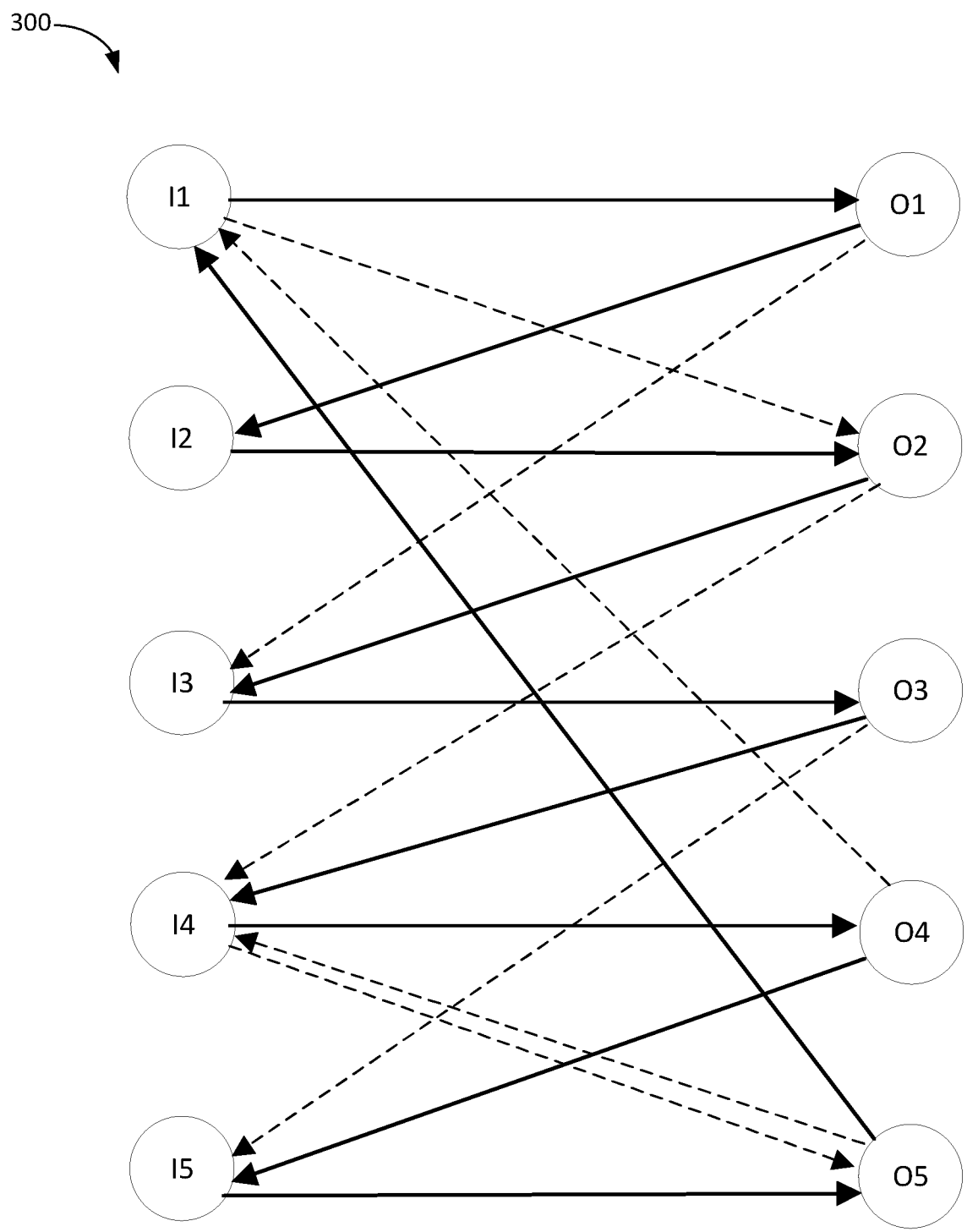
FIG. 3 is an example block diagram of a bipartite graph.

FIG. 3 is an example block diagram of a bipartite graph. The bipartite graph illustrates dataflow configuration and components of a neural network architecture. The edges connect the input vertices (I1-5) to the output vertices (O1-5) to represent computing tiles. In this example, a computing tile is represented by a particular input vertex, a particular output vertex connected together with an edge. A dataflow configuration between vertices is illustrated with solid edges. For example, an edge that goes from an output vertex to an input vertex illustrates the transmission of data from the output of one tile to the input of another tile. A redundant dataflow configuration is illustrated with dashed edges. The dashed edges represent alternative dataflow paths between the vertices in the instance a tile is deemed faulty and is bypassed.

If a tile is faulty, the corresponding edge between an input vertex and a corresponding output vertex is removed from the graph. This illustrates that there is no data transmitted from the input of the computing tile to the output of the computing tile and the processing element 202 does not execute any computations. If the switch 204 of the computing tile is still functional, the vertices remain in the network graph because the processing element 202 of a tile can still be bypassed using the processing element bypass. Edges from the output vertices to the input vertices represent the possible connections that the switches and the vertical communicative coupling can realize. There will be multiple allowable edges per vertex representing the possible configurations that the switches can be configured to direct inputs to outputs.

To bypass a faulty tile and increase three dimensionally stacked neural network yield, a Hamiltonian circuit is applied to the graph. The Hamiltonian circuit can illustrate a ring bus that is a closed tour of data propagations such that each active vertex receives and transmits data exactly once. The Hamiltonian circuit is the maximum length circuit that can be achieved by incorporating each functional vertex. The three dimensionally stacked neural network accelerator offers more alternate paths for dataflow configurations than a two dimensional neural network accelerator. Therefore, the probability that an optimal or near optimal configuration (e.g., a Hamiltonian circuit) can be found is higher for the three dimensionally stacked neural network accelerator than for a two dimensional network accelerator.

Figure 4:
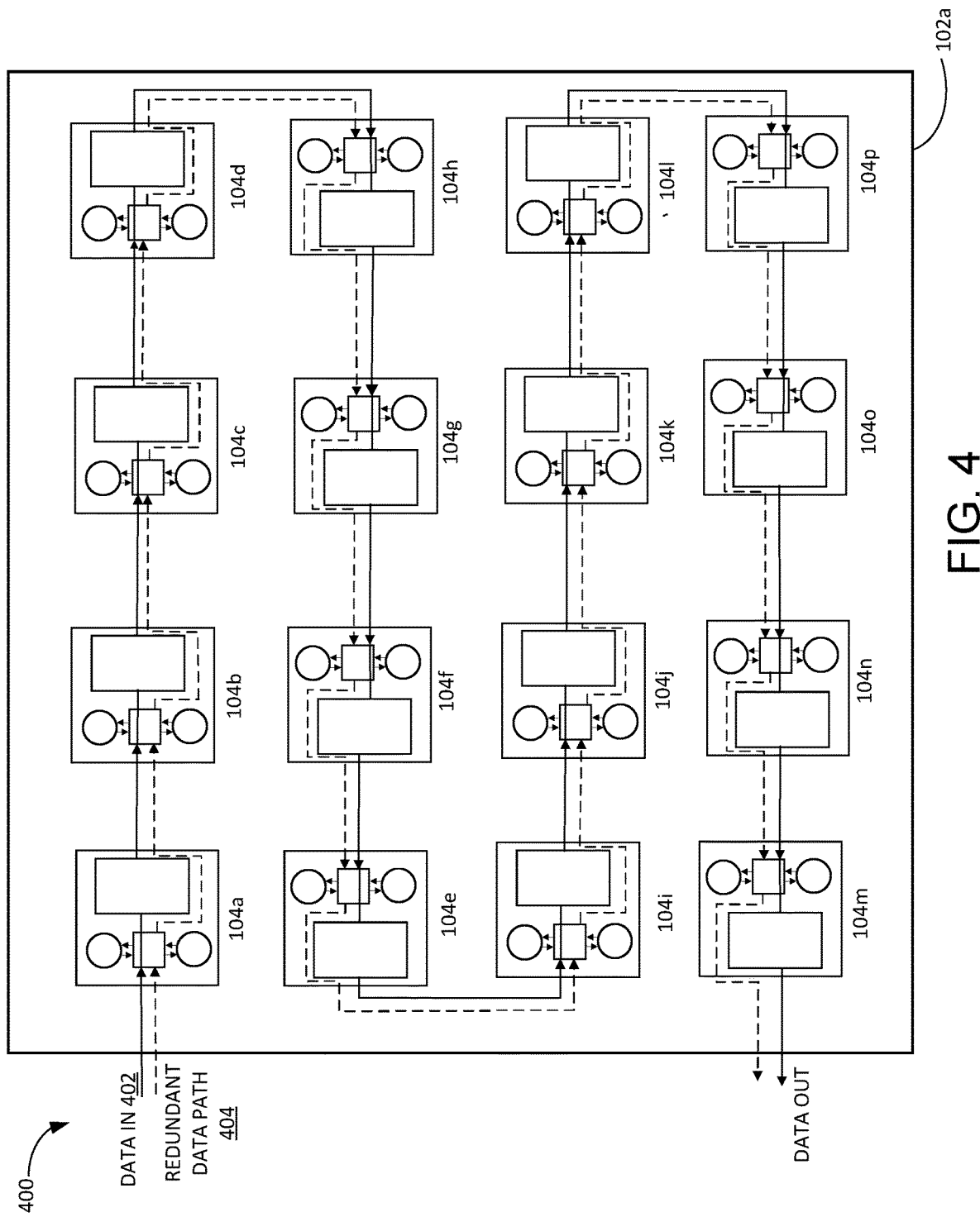
FIG. 4 illustrates an example neural network dataflow configuration.

FIG. 4 illustrates an example neural network die 400 and a dataflow configuration for the example neural network die's tiles 104a-p. Generally, however, the tiles 104a-p can be arranged in any arrangement on the die 200. The tiles 104a-p are organized in a rectangular arrangement such that tiles located on vertically adjacent dies are configured in the same position. For example, the first tile 104a on the first die 102a is located above the first tile 104a on the second die 102b, which is located above the first tile 104a on the third die 102c, etc. In addition, inputs and outputs of vertically adjacent tiles have a mirrored or rotational symmetry. For example, the inputs and outputs of the first tile 104a on the first die 102a are positionally located on the die in the same orientation as the inputs and outputs for the first tile 104a on the second die 102b located in the stack above or below the first die 102a.

Each tile 104a-p is communicatively coupled with the tile's neighboring tiles on the die 400. In this example, the first tile 104a is communicatively coupled with the second tile 104b. However, tiles 104a-p can be communicatively coupled in any configuration. Tiles 104a-p on neural network die 102a can be connected together using wired connections. The wired connections enable transmission of data between each connected tile 104a-p.

Each tile communicates with one or more adjacent tiles 104a-p to create a Hamiltonian circuit representation using the tiles 104a-p. The circuit includes a communication scheme such that there is an uninterrupted flow of tile inputs connected to tile outputs, from the beginning of the ring bus to the end of the ring bus. For example, the tiles 104a-p are configured such that the input and output of each functional tile within the ring network is connected to another functional tile or external source according to a dataflow configuration. The dataflow configuration describes a path of computational data propagation through the tiles 104a-p within a three-dimensional neural network architecture.

For example, and referring to FIG. 4, in some implementations, a dataflow configuration 402 may specify that a first tile 104a, on a die 102a, receives input data from an external source. In some implementations, the external source can be a tile 104a-b on a different neural network accelerator die 102b-e, or some other source that transmits data. The first tile 104a executes computations using the data and transmits the data to a second tile 104b. Likewise, the second tile 104b computes the data, and transmits the data to a third tile 104c. In this implementation, the process continues along the first row of tiles until the data reaches a fourth tile 104d. The fourth tile 104d transmits the data to a fifth tile 104h.

The process continues until the data reaches tile 104e. In like manner, data is transmitted to the ninth tile 104i. The data is propagated along across the third row of tiles to the twelfth tile 104l. The twelfth tile 104l transmits the data to the thirteenth tile 104p. The dataflow configuration continues to transmit the data to the sixteenth tile 104m, where the sixteenth tile 104m transmits the data to an external source or back to the first tile 104a. In this implementation, the dataflow configuration for the tiles 104a-p on the first die 102a is 104a-b-c-d-h-g-f-e-i-j-k-l-p-o-n-m. In other implementations, the dataflow configuration can be a different path of data travel through the set of tiles. The dataflow configuration is specified based on which switch input is connected to which tile's output. Because there are a plurality of tiles 104a-p, each tile with a respective output, and because the switch's input can be varied to receive different tiles' outputs, many different dataflow configurations can be achieved.

In some instances, some tiles 104a-p may be faulty after production of the three dimensionally stacked neural network accelerator 100. Post-production tests are executed after stacking the dies to identify which tiles are faulty. The identified faulty tiles are bypassed, and a dataflow configuration is established that eliminates the use of the faulty tiles. The tile configuration includes a redundant data path 304 that can be implemented to bypass faulty tiles 104a-p. Eliminating a faulty tile(s) can include directing computational data to every other tile in the three-dimensionally stacked neural network except the identified faulty tiles. Each other tile will perform its designated computational functions as part performing the computation of the neural network. In this instance, the other tiles can collectively perform the computations of the identified faulty tiles or one tile can be dedicated to perform the computations of the identified faulty tile.

Figure 5:
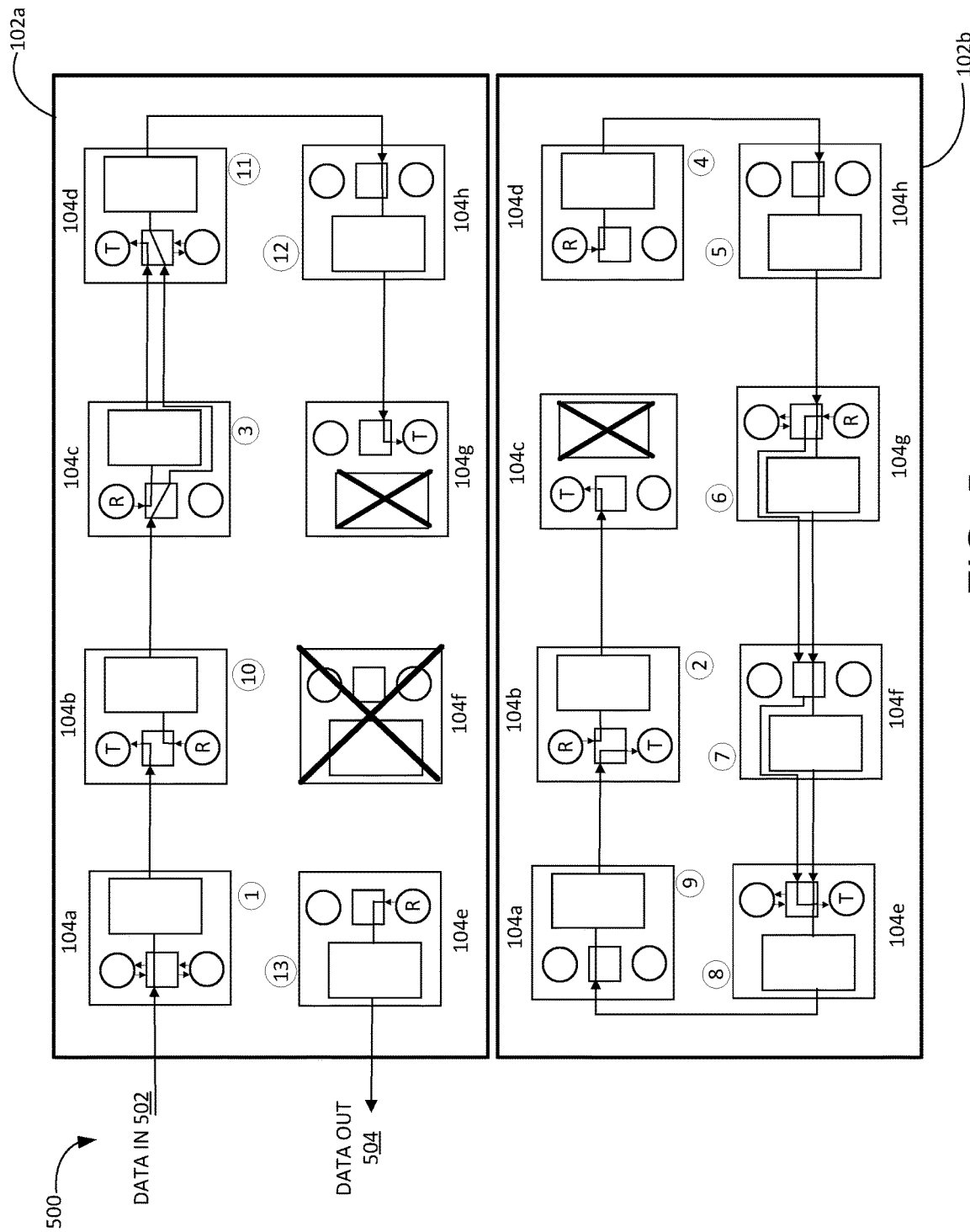
FIG. 5 illustrates an example dataflow configuration for a three-dimensionally stacked neural network accelerator.

FIG. 5 illustrates an example dataflow configuration 500 for a three-dimensionally stacked neural network accelerator. In this example, the neural network accelerator includes two neural network dies, a top die 102a and a bottom die 102b arranged using a pair of inductively coupled connections to aggregate two rings together to form one ring of 16 tiles distributed over two chips stacked vertically. In some implementations, the three-dimensionally stacked neural network accelerator includes more than two dies stacked together (e.g., 3-10 dies). Each die includes a plurality of tiles 104a-h. The tiles 104a-h on both dies process data to perform neural network computations according to the dataflow configuration of data propagation through the tiles 104a-h.

In this example, tile 104f on the top die 102a is a total die failure. A total die failure occurs when the bypass fails or the switch fails and the processing unit fails. In a two dimensional neural network accelerator example with one die having a failure scenario consistent with the top die 102a illustrated in FIG. 5, the entire die would be a total failure because the dataflow configuration could not create a continuous dataflow path around the die. Because tile 104f on the top die 102a is a total die failure, neighboring tiles cannot output data to tile 104f because there is no way for tile 104f to output data to another tile 104a-h. Thus, as illustrated in FIG. 5, no tiles output data to the input of tile 104f and tile 104f is completely bypassed by transmitting data to tiles adjacent and vertically adjacent to tile 104f.

Tile 104g on the top die 102a and tile 104c on the bottom die 102b are partial failures. A partial failure occurs where a processing element 202 fails, but the switch and data path is still functional. A tile that is experiencing a partial failure can still receive input data because the tile's switch 204 is still functional. Therefore, the partially failed tile's switch 204 can output to data to different tiles 104a-h using the transmitting inductive coils or output data using the processing element bypass 208. As illustrated in FIG. 5 tile 104g on the top die 102a and tile 104c on the bottom die 102b utilize the transmitting inductive coils to output data to the vertically adjacent tiles. However, in other implementations, tile 104g on the top die 102a and tile 104c on the bottom die 102b could either both or uniquely utilize the processing element bypass 208 to output data to adjacent tiles 104a-h.

FIG. 6 is an example flow chart of a process executed by a system of one or more computers for modifying a dataflow configuration for tiles within a three-dimensionally stacked neural network accelerator 600. Aspects of FIG. 6 will be discussed in connection with FIG. 5. For example, the process can be performed by a host computer to which the accelerator is coupled.

Three-dimensionally stacked neural network accelerator tiles are tested to determine functionality of each of the plurality of tiles on the neural network wafers and identify faulty tiles. Techniques for die testing include using out of band control channels, for example, joint test action group scan chain, to test each of the tiles within the three-dimensionally stacked neural network accelerator. The test identifies which tiles are faulty and are to be bypassed to create the Hamiltonian circuit. In some implementations, the system is configured to determine the Hamiltonian circuit based on the arrangement of functional tiles 104*a-h* within the three-dimensionally stacked neural network accelerator. In addition, the system can implement the dataflow configuration using the remaining functional tiles 104*a-h* of the three dimensional neural network accelerator according to the determined Hamiltonian circuit.

The testing can occur prior to or after stacking the neural network wafers 102*a-b*. For example, testing can occur prior to cutting the larger fabricated wafers into smaller dies designed for the three-dimensionally stacked-neural network accelerators. In this instance, each tile on the larger fabricated wafer is tested for functionality. Alternatively, after cutting larger fabricated wafers into dies designed for the three-dimensionally stacked-neural network accelerators, the dies are stacked together to create the three-dimensionally stacked neural network accelerator, and each tile is tested for functionality. In either instance, the tiles 104*a-p* are tested prior to executing computations on the three-dimensionally stacked neural network accelerator.

In other implementations, three-dimensionally stacked neural network accelerators are constantly analyzed during operation of the neural network accelerator to determine tiles, that may have been operational during the initial functional testing, but have since failed or become faulty.

Referring to FIG. 6, the process includes determining that a tile from a plurality of tiles in a three-dimensional stacked neural network accelerator is a faulty tile (402). A faulty tile is a tile that does not function as designed based on the analyzing. As previously described, the three-dimensionally stacked neural network accelerator comprises a plurality of neural network accelerator dies 102*a-e* stacked on top of each other and each neural network accelerator die includes a respective plurality of tiles 104*a-p*. Each tile has a plurality of input and output connections that transmit data into and out of the tile. The data is used to execute neural network computations.

Referring back to FIG. 4, in the illustrated example 300, the sixth and seventh tile 104*c* on the top die 102*a* and the third tile on the bottom die 102*b* has been determined to be faulty. Faulty tiles 104*f* and *g* on the top die 102*a* and 104*c* on the bottom die 102*b* are bypassed and removed from the dataflow configuration. Removing the faulty tiles includes modifying the dataflow configuration to transmit an output of a tile before the faulty tile in the dataflow configuration to an input connection of a tile that is positioned above or below the faulty tile on a different neural network die than the faulty tile (404).

In some implementations, bypassing the faulty tile includes removing power that is provided to the faulty tile 104*c*. Power can be removed from the faulty tile 104*c* by disconnecting a switch that provides power to the faulty tile or using programming logic to remove power provided to the tile. Removing power provided to the faulty tile 104*c* ensures that the faulty tile is not operational and the faulty tile 104*c* does not draw unnecessary power from a power source providing power to the three-dimensionally stacked neural network accelerator. Further, data is transmitted either around the faulty tile or through the faulty tile, but not to the processing element 202 of the faulty tile.

In other implementations, bypassing the faulty tile 104*c* can include turning off a clock that is unique to the faulty tile. The faulty tile's clock can be disabled using programming logic or physically removing the clock from the circuit by disconnecting the clock's output. Turning off the faulty tile's clock stops the clock from executing processing functions, thereby deactivating the faulty tile and ceasing the faulty tile's operation.

According to the example illustrated in FIG. 5, the faulty tiles are bypassed and the dataflow configuration is modified according to a Hamiltonian circuit representation of the tile dataflow configuration. For example, one implementation can include having the first tile 104*a* on the top die 102 receives input data from an external source (1). The first tile 104*a* processes the data, and the first tile 104*a* transmits output data to the switch of the second tile 104*b*. The switch 202 of the second tile 104*b* of the top die 102*a* directs the data to the transmitting inductive coil (T) and transmits the data to the second tile 104*b* of the bottom die 102*b*. For ease of illustration, the inductive coils have been presented as single coils, however, as previously mentioned, each of the inductive coils are a plurality of coils communicatively coupled to transmit and receive data from other coils on vertically adjacent tiles.

The second tile 104*b* of the bottom die 102*b* processes the data (2) and transmits the data to the third tile 104*c* of the bottom die 102*b*. Since, the third tile 104*c* of the bottom die 102*b* was determined to be faulty, the processing element is bypassed and the data is sent to the transmitting inductive coil (T), which transmits the data using inductive coupling to the receiving inductive coil (R) of the third tile 104*c* of the top die 102*b*. The processing element processes the data (3) and transmits the data to the switch 202 of the fourth tile 104*d* of the top die 102*a*. The switch transmits the data to the transmitting inductive coil (T) of the fourth tile 104*d* of the top die 102*a*, which transmits the data to the fourth tile 104*d* of the bottom die 102*b*. The fourth tile 104*d* of the bottom die 102*b* processes the data (4) and the output is transmitted to the eight tile 104*h* of the bottom die 102*b*.

The processing element of the eighth tile 104*h* processes the data and the output is transmitted to the switch of the seventh tile 104*g* on the bottom die 102*b*. The seventh tile 104*g* processes the data (6) and the output is transmitted to the switch of the sixth tile 104*f* of the bottom die 102*b*. The sixth tile 104*f* processes the data (7) and the output is transmitted to the switch of the fifth tile 104*e* on the bottom die 102*b*. The fifth tile's processing element processes the data (8) and the output is transmitted to the first tile 104*a* of the bottom die 102*b*. The first tile 104*a* processes the data (9) and the output is transmitted to the switch of the second tile 104*b* of the bottom die 102*b*.

The second tile's switch transmits the data the second tile's transmitting inductive coil (T), which transmits the data to the receiving inductive coil (R) of the second tile 104*b* of the top die 102*a*. The second tile's processing element processes the data (10) and the output is transmitted to the switch of the third tile 104*c* of the top die 102*b*. The data is transmitted using the processing element bypass to bypass the third tile's processing element and the data is transmitted to the switch of the fourth tile 104*d* of the top die 102a. The fourth tile 104d processes the data (11) and transmits the data to the eight tile 104h of the top die 102a.

The eight tile 104h processes the data (12) and the output is transmitted to the switch of the seventh tile 104g of the top die 102a. As previously described, the seventh tile 104g of the top die was determined to be faulty during testing. Therefore, the seventh tile's switch transmits the data to the transmitting inductive coil (T) of the seventh tile 104g. The transmitting inductive coil (T) directs the data to the receiving inductive coil (R) of the seventh tile 104g of the bottom die 102b. The seventh tile's switch directs the data to the sixth tile 104f of the bottom die 102b using the processing element bypass. The switch of the sixth tile 104f transmits the data to the switch of the fifth tile 104e of the bottom die 102b using the sixth tile's processing element bypass.

The fifth tile 104e directs the data to the transmitting inductive coil (T) of the fifth tile 104e, which transmits the data to the receiving inductive coil (R) of the fifth tile 104e of the top die 102a. The fifth tile 104e processes the data (13) and the output is either directed back to the first tile 102a of the top die 102a or directed to an external device. During testing of the three-dimensionally stacked neural network accelerator, the sixth die 104f of the top die 102a was identified as faulty. In this example, no data was routed to the sixth die 104f and the sixth die 104f was completely bypassed.

Embodiments of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively, or in addition, the program instructions can be encoded on an artificially generated propagated signal, e.g., a machine-generated electrical, optical, or electromagnetic signal, which is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output(s). The processes and logic flows can also be performed by, and apparatus can also be implemented as, special purpose logic circuitry, e.g., an FPGA (field programmable gate array), an ASIC (application specific integrated circuit), or a GPGPU (General purpose graphics processing unit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A circuit, comprising:
    a plurality of dies vertically stacked on top of each other, each die including a plurality of tiles,
        each of the plurality of tiles comprising a multiplexer,
        wherein the multiplexer of each tile is connected to outputs of a plurality of other tiles in the plurality of tiles and controls which output of the outputs of the plurality of other tiles the tile receives as an input;
        wherein the plurality of tiles includes a first tile on a first die that has been determined to be a faulty tile; and
        wherein a dataflow configuration is configured to route the output of a tile on the first die prior to the faulty tile on the first die in an initial dataflow configuration to an input of a tile on a second different die and vertically adjacent to the faulty tile on the first die instead of to an input of the faulty tile on the first die.

2. The circuit of claim 1, further comprising inductive coupling between tiles on different dies enabling communication between the tiles on different dies.

3. The circuit of claim 1, further comprising, for each multiplexer, a respective controller coupled to the multiplexer, wherein the controller is configured to transmit instructions to the multiplexer to designate an active input for the multiplexer.

4. The circuit of claim 1, further comprising, for each wafer, a respective controller coupled to each multiplexer included on the wafer, wherein the controller is configured to transmit instructions to each multiplexer included on the wafer to designate an active input for each multiplexer.

5. The circuit of claim 1, further comprising, a controller coupled to each multiplexer, wherein the controller is configured to transmit instructions to each multiplexer to designate an active input for each multiplexer.

6. The circuit of claim 1, wherein to define the dataflow configuration to route the output of the tile on the first die prior to the faulty tile on the first die in the initial dataflow configuration to an input of a tile on the second different die and vertically adjacent to the faulty tile on the first die, the input of the multiplexer of the tile on the second different die and vertically adjacent to the faulty tile on the first die is set to receive the output of the tile on the first die prior to the faulty tile on the first die in the initial dataflow configuration.

7. The circuit of claim 1, wherein the faulty tile has been disabled.

8. The circuit of claim 7, wherein disabling the faulty tile comprises removing power that is distributed to the faulty tile.

9. The circuit of claim 7, wherein disabling the faulty tile comprises turning off a clock that is unique to the faulty tile.

10. The circuit of claim 1, wherein each tile communicates with one or more adjacent tiles to create a ring network of tiles, wherein the ring network is configured such that each functional tile within the ring network receives and transfers data.

* * * * *